United States Patent [19]

Lee et al.

[11] 3,805,095

[45] Apr. 16, 1974

[54] FET THRESHOLD COMPENSATING BIAS CIRCUIT

[75] Inventors: James M. Lee, Wappingers Falls; George Sonoda, Poughkeepsie, both of N.Y.

[73] Assignee: International Business Machines Corporation, Armonk, N.Y.

[22] Filed: Dec. 29, 1972

[21] Appl. No.: 319,266

[52] U.S. Cl. .................................. 307/304, 307/251

[51] Int. Cl. .................................. H03k 3/26

[58] Field of Search ........ 307/205, 221 C, 251, 279, 307/304

[56] References Cited

UNITED STATES PATENTS

| | | | |
|---|---|---|---|
| 3,407,339 | 10/1968 | Booher | 307/251 |
| 3,582,688 | 6/1971 | Hilbert | 307/279 |
| 3,638,047 | 1/1972 | Klein | 307/221 C |
| 3,708,689 | 1/1973 | Lattin | 307/251 |
| 3,648,153 | 3/1972 | Graf | 307/297 |
| 3,697,777 | 10/1972 | Donoghue | 307/304 |
| 3,648,065 | 3/1972 | Hoffman | 307/251 |
| 3,508,084 | 4/1970 | Warner | 317/235 G |
| 3,564,290 | 2/1971 | Sonoda | 307/251 |

*Primary Examiner*—Rudolph V. Rolinec
*Assistant Examiner*—R. E. Hart
*Attorney, Agent, or Firm*—Theodore E. Galanthay

[57] ABSTRACT

Disclosed is a bias circuit that eliminates the adverse effect of threshold voltage variations on field effect transistor (FET) circuit performance. The gate electrode of a load device is maintained at one threshold level above the supply potential regardless of threshold voltage variations, optimizing the linear impedance characteristics of the load device and the power/performance characteristics of the resultant FET circuit.

10 Claims, 2 Drawing Figures

FET THRESHOLD COMPENSATING BIAS CIRCUIT

CROSS REFERENCE TO RELATED APPLICATIONS AND PATENTS

M. S. Axelrod, U. S. Pat. No. 3,406,298, "Integrated IGFET Logic Circuit With Linear Resistive Load," issued Oct. 15, 1968 and assigned to the assignee of the present application.

G. Sonoda, U. S. Pat. No. 3,564,290, "Regenerative FET Source Follower," issued Feb. 16, 1971, and assigned to the assignee of the present application.

BACKGROUND OF THE INVENTION

1. Field of the Invention

This invention relates to field effect transistor circuits and more particularly to an FET threshold compensating bias circuit for providing linear impedances in FET circuits regardless of threshold variations.

2. Description of the Prior Art

The desirability of maintaining linear load impedances in FET circuits was recognized in the prior art. For example, see the cross-referenced U. S. Pat. No. 3,406,298 which is hereby incorporated herein. In the cross-referenced patent, the desirability of the linear resistive load was recognized and solved by holding the gate electrode of a load FET at a higher potential than the potential applied to the drain electrode.

Another problem with FET load devices also recognized in U. S. Pat. No. 3,406,298 is that the output potential at the source electrode of the load FET cannot rise to the level of the supply potential applied to the drain electrode unless the gate electrode is held at an even higher potential. This problem is also solved if the load resistance is made linear. Frequently, however, it is undesirable to provide a second power supply that is separate and higher than the potential applied to the drain electrode of the load device. Also, for optimization of power/performance, it is desirable to hold the gate electrode of a load device precisely one threshold level above the potential applied to the drain electrode. Since threshold voltages vary by ratios of 2-1 or more, significant problems arise if an external power supply with the proper relationship of drain and gate potentials must be supplied with each individual semiconductor chip.

Another known technique for overcoming the undesirable non-linear resistance characteristics of FET loads is the use of a bootstrap capacitor illustrated in U. S. Pat. No. 3,564,290. In this latter patent, a capacitor connected between the gate and source electrodes of an output FET causes the rise of the potential at the source electrode to cause the potential at the gate electrode to increase above the level of the potential supply at the drain electrode permitting the source electrode to rise to the potential of the drain electrode. A feedback or bootstrap capacitor of this type, however, must be significantly greater than the inherent gate to substrate capacitance already present at the gate electrode. In some logic circuits, therefore, the available semiconductor area precludes the use of a gate to source feedback capacitance to overcome threshold voltages. Also, it is known that the high potential at the gate electrode provided by the feedback capacitance has a tendency to dissipate in the case of output signals of long up level duration.

SUMMARY OF THE INVENTION

Accordingly, it is an object of this invention to provide an FET circuit with improved power/performance characteristics.

It is another object of this invention to provide an improved linear FET load device.

It is a further object of this invention to bias the gate electrode of a load FET precisely one threshold level above the potential at its drain electrode.

It is a still further object of this invention to provide an FET load device having a constant impedance independent of threshold variables occasioned by process techniques inherent in field effect transistor fabrication.

In accordance with the present invention, an astable pulse source is provided on the same semiconductor chip or body with the desired FET circuit. The astable pulse source charges a first node through a capacitance to a higher potential than the supply potential. This higher potential from the first node is transmitted through an isolation FET to the output node of the threshold voltage compensating bias circuit. The output node is clamped to one threshold level above the supply potential by a clamping FET. This potential level is then applied to all the load devices on the chip for which a linear impedance is desired. It is known that large threshold variations in the processing of field effect transistors are unavoidable and caused by difficult to control process variations including contamination in the gate oxide region as well as variations in the gate oxide thickness. However, for a particular semiconductor chip, there is relatively little threshold variation among the various devices on the particular chip. Accordingly, since the threshold voltage compensating bias circuit is on the same chip with the other circuits and particularly since the clamping FET is on the same chip with the remainder of the logic circuit, the output potential of said threshold voltage compensating bias circuit will be clamped to precisely one threshold level above the supply potential. Since this output is useable for a large number of linear load devices, the added circuitry required to generate this bias circuit can take up a relatively insignificant amount of semiconductor area. The circuit has the further advantage of maintaining this desired precise bias potential in the steady state.

The foregoing and other objects, features and advantages of the invention will be apparent from the following more particular description of a preferred embodiment of the invention, as illustrated in the accompanying drawings.

IN THE DRAWINGS

DESCRIPTION OF THE PREFERRED EMBODIMENTS

Figure 1:
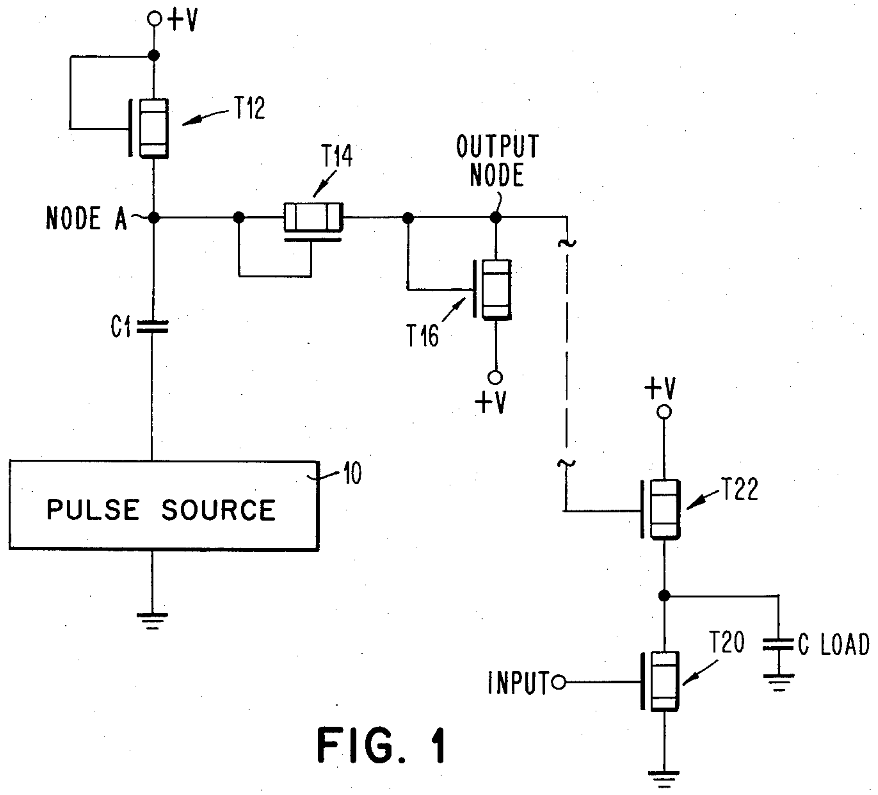
FIG. 1 shows a circuit arrangement of the present invention connected to a linear load device.

Refer now to FIG. 1 for a description of the preferred embodiment of this invention. Astable pulse source 10 is a pulse source supplying signals at its output through capacitor C1 to node A. Also connected to node A is charging transistor T12 having a drain-to-source path connected between a first potential level and node A.

The gating electrode of T12 is also connected to the first potential level. Nominally, +V is approximately 8 volts and capacitance C1 is approximately 3 pf. Isolation transistor T14 has its drain-to-source path connected between node A and the output. The gating electrode of T14 is also connected to node A. Clamping transistor T16 is connected between the output node and the first level potential source. This concludes the description of the FET threshold voltage compensating bias circuit of the present invention. Also, shown in FIG. 1, is one of a plurality of typical circuits to which the output node would normally be connected. Such a circuit consists of a simple inverter consisting of a signal transistor T20 and a load device T22 having their drain-to-source paths connected in series between the first potential level source (+V) and the second potential level source (ground). The output is taken from a common connection between T20 and T22 to what is shown as a capacitive load to ground. The load capacitance is not necessarily a discrete capacitor but rather represents subsequent stages of field effect transistor circuits. The gate electrode of T20 receives an input signal while the gate electrode of the load device, T22, is connected to the FET threshold voltage compensating bias circuit of the present invention.

OPERATION

The FET inverter circuit consisting of transistors T20 and T22 operates in its normal and well known manner. An up level signal at the gate electrode of T20 causes T20 to conduct bringing the output node to ground potential. A down level input at the gating electrode of T20 turns T20 off causing the output to rise to +V. This up level is reached in an optimum and efficient manner due to the particular biasing of load device T22 in accordance with the present invention.

Figure 2:
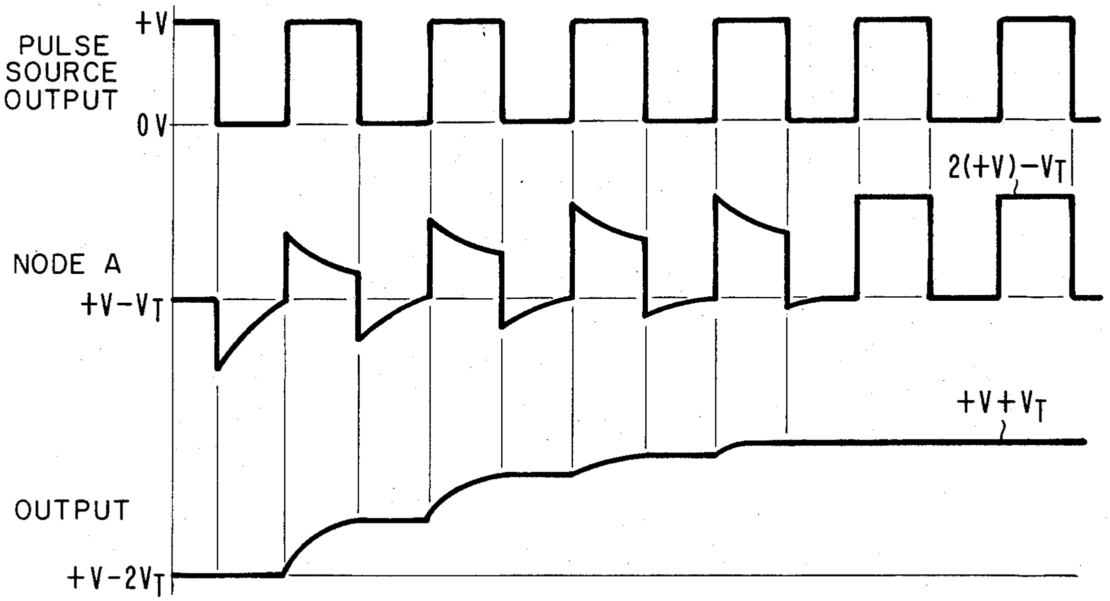
FIG. 2 is a waveform diagram illustrating the operation of the present invention.

With continued reference to FIG. 1, refer also to FIG. 2 for a description of the operation of the FET threshold voltage compensating bias circuit of the present invention. The astable pulse source output is a square wave of suitable frequency (such as 1 mega cycles per second, for example, for typical leakage of 2 A at the output node, and varies between the two available potential levels (ground and +V.) Numerous pulse generators are available and known to perform this intended function. This pulse source output is applied through capacitor C1 to node A. Initially, node A charges to one threshold level below +V through charging transistor T12. The continued application of pulses through capacitor C1, however, causes node A to rise to a level in excess of +V. This potential less one threshold drop through isolation transistor T14 is expected to be transferred to the output node. However, clamping transistor T16 prevents the output node from rising to a potential higher than one threshold voltage drop above +V. Since the threshold voltage drop of transistor T16 is similar to that of the plurality of load devices such as T22 on the same chip, the gating electrode of transistors such as T22 is maintained at one threshold voltage above +V.

The foregoing circuit was, in the preferred embodiment, implemented in N channel FET technology. It can also be implemented in P channel FET technology in which case the polarity of the potential sources and waveforms within the circuit would be reversed. It is well known that P channel devices turn on with down level signals and off with up level signals. Also, the terms charging and discharging as used herein are relative terms indicating current flow into or out of a capacitance such as a capacitive node, for example. Therefore, the reversal of the occurrence of these two events would be within the intent of the present invention.

Accordingly, while the invention has been particularly shown and described with reference to a preferred embodiments it will be understood by those skilled in the art that various changes in form and detail may be made therein without departing from the spirit and scope of the invention.

What is claimed is:

1. A threshold compensating bias circuit for establishing a linear impedance field effect transistor load device having at least one gating electrode and a plurality of gated electrodes, said bias circuit omprising:

a source of power;

a first node electrically coupled to said source of power, means electrically coupled to said first node for increasing the potential level at said first node in excess of the highest potential level of said source of power;

an output node;

isolation means connected in an electrical path between said first node and said output node; and clamping means electrically coupled to said output node for maintaining said output node at one threshold level above the highest potential level of the source of power.

2. A circuit as in claim 1 further including:

means for electrically coupling said output node to at least one gating electrode of the load device.

3. A circuit as in claim 2 fabricated entirely on a single monocrystalline semiconductor body.

4. A circuit as in claim 3 fabricated in N channel field effect transistor technology.

5. A circuit as in claim 1 wherein said first node is electrically coupled to said source of power by means comprising:

a field effect transistor having two gated electrodes and a gating electrode, one gated electrode and the gating electrode being connected to said source of power, the other gated electrode being connected to said first node.

6. A circuit as in claim 1 wherein said means electrically coupled to said first node comprises:

a pulse source; and a capacitance electrically coupled in a series path between said pulse source and said first node.

7. A circuit as in claim 1 in which said isolation means comprises:

a field effect transistor having two gated electrodes and a gating electrode, one gated electrode and the gating electrode being connected to said first node, the other gated electrode being connected to said output node.

8. A circuit as in claim 1 in which said clamping means comprises:

a field effect transistor having two gated electrodes and a gating electrode, one gated electrode and the gating electrode being connected to said output node, the other gated electrode being connected to said source of power.

9. A threshold compensating bias circuit for establishing a linear impedance field effect transistor load device having at least one gating electrode and a plurality of gating electrodes, as in claim 1, further comprising:

means for electrically connecting said output node to said at least one gating electrode of said field effect transistor load device.

10. A circuit as in claim 1 wherein said means electrically coupled to said first node comprises:

an astable pulse source; and a capacitance electrically coupled in a series path between said pulse source and said first node.

* * * * *